United States Patent [19]
Takaki

[11] Patent Number: 6,032,031
[45] Date of Patent: Feb. 29, 2000

[54] RECEIVER FOR SUPPRESSING INTERMODULATION

[75] Inventor: Tetsuya Takaki, Tokyo, Japan

[73] Assignee: NEC Corporation, Japan

[21] Appl. No.: 08/954,911

[22] Filed: Oct. 21, 1997

[30] Foreign Application Priority Data

Oct. 23, 1996 [JP] Japan .................................. 8-280742

[51] Int. Cl.[7] .................................................. H04B 1/10
[52] U.S. Cl. .................................. 455/245.2; 455/234.1; 455/251.1; 455/253.1; 330/149; 375/345
[58] Field of Search ........................... 455/232.1, 234.1, 455/234.2, 236.1, 311, 312, 295, 237.1, 240.1, 241.1, 245.1, 245.2, 246.1, 248.1, 249.1, 250.1, 251.1, 253.2; 330/284, 144, 145, 149; 375/345

[56] References Cited

U.S. PATENT DOCUMENTS

| | | | |
|---|---|---|---|
| 4,013,964 | 3/1977 | Skutta ................................... | 455/249.1 |
| 4,030,035 | 6/1977 | Ienaka et al. ......................... | 455/245.2 |
| 5,050,192 | 9/1991 | Nawata .................................. | 455/245.1 |
| 5,697,081 | 12/1997 | Lyall et al. ............................ | 455/249.1 |

FOREIGN PATENT DOCUMENTS

| | | |
|---|---|---|
| 61-157033 | of 1986 | Japan . |
| 3214931 | of 1991 | Japan . |
| 5-335857 | 12/1993 | Japan . |
| 7-212262 | 8/1995 | Japan . |
| 8018469 | of 1996 | Japan . |

OTHER PUBLICATIONS

Office Action Issued by the Japanese Patent Office on Jan. 13, 1999 in the Corresponding Japanese Application.

*Primary Examiner*—Lee Nguyen
*Attorney, Agent, or Firm*—Ostrolenk, Faber, Gerb & Soffen, LLP

[57] ABSTRACT

In a receiver used in radio communication, when two or more interfering waves having different frequencies exist (other than a received signal frequency), a deterioration of a receiving sensitivity by a cross modulation signal produced by a non-linearity of a high-linearity of a high-frequency amplifier and a frequency converter is eliminated. The received signal from an antenna and an antenna sharer is provided via a first variable gain amplifier and via a band pass filter to a frequency converter. A local oscillating signal is mixed with these signals and a signal in an intermediate frequency band is outputted via a band pass filter to a second variable gain amplifier having a gain which is controlled such that an input signal power level of a demodulator is constant. A gain control signal of the second variable gain amplifier is used as a gain quantity. The control circuit obtains a gain control quantity based on the control signal, and also a power quantity of the received signal from a gain increase/decrease in each block of the receiver. The signal from the second variable gain amplifier is demodulated by the demodulator, converted to a base band signal, and after A/D conversion, fed to an error ratio calculation unit. A gain quantity control unit controls the gain quantity of the first variable gain amplifier.

13 Claims, 5 Drawing Sheets

RECEIVER FOR SUPPRESSING INTERMODULATION

BACKGROUND OF THE INVENTION

1. Field of the Invention

The present invention relates to a receiver used in radio communication and more, particularly, to a receiver in which intermodulation caused by a plurality of interfering waves synthesized by a non-linearity of a receiver is effectively suppressed, when two or more intense interfering waves (other than) a signal being received by the receiver, exist at the same time.

2. Description of the Prior Art

In a receiver used in a radio communication equipment, such as a cellular phone, a radio selective calling receiver (a so-called pager) or the like, two or more intense interfering wave signals (other than the desired wave signal being received by the receiver) may exist at the same time. These interfering wave signals are synthesized by a non-linearity of a high-frequency amplifier and a frequency mixer constituting the receiver, and may fall to a frequency of the desired wave signal as the case may be. This problem is usually known as a cross modulation or an intermodulation (hereinafter abbreviated as IM), which is an important factor influencing the performance of the receiver. Upon generation of an IM signal, even when the receiver receives the desired wave signal sufficiently large relative to thermal noise, a receiving property of the receiver are deteriorated. This causes a deterioration of an error ratio in digital communication or a deterioration of SINAD (Signal+ Noise+Distortion to Noise+Distortion ratio) in analog communication.

Here, methods of preventing the deterioration of the receiving property of the receiver caused by the IM signal are disclosed in a publication of patent application laid-open No. Hei 5-335857 (hereinafter, referred to as the first prior art) and a publication of patent application laid-open No. Hei 7-212262 (hereinafter, referred to as the second prior art).

FIG. 1 is a view showing a constitution of a receiver disclosed in the first prior art. In FIG. 1, a signal received by an antenna 11 is amplified in a high-frequency amplifier 13, passes a variable attenuator 15, and is filtered in a high-frequency (band pass) filter 17. The signal transmitted from the high-frequency filter 17 is branched into frequency mixers (converters) 19 and 21, and converted to base band signals by a local oscillating signal from local oscillator 23 and phase shifter ($\pi/2$) 25 (which provides a $\pi/2$ phase shift). Thereafter, the base band signals from the frequency mixers 19 and 21 pass base band filters 27 and 29, respectively, and are demodulated into digital signals via demodulator 31. A frame synchronous signal is detected in a control circuit 33. If the frame synchronous signal is not detected within a predetermined time in the control circuit 33, a step-out signal is transmitted from the control circuit 33 to a gain control means 35, and the gain control means 35 changes an attenuation quantity of the variable attenuator 15. By changing the attenuation quantity of the variable attenuator 15, influence of cross modulation caused by interfering waves is removed. When the frame synchronous signal is detected in the control circuit 33, the gain control means 35 operates so as to reset the attenuation quantity of the variable attenuator 15 to its original value. Here, for convenience of description, the frequency mixers 19, 21, the local oscillator 23, the phase shifter 25 and the base band filters 27 and 29 are called a base band signal conversion means 39. Also, the variable attenuator 15, the gain control means 35, the demodulator 31 and the control circuit 33 are called a control means 37.

According to the prior art, considering the attenuation quantity of the variable attenuator 15 beforehand, when a field strength of the received signal transmitted to the control circuit 33 is large and no frame synchronous signal is detected, then it is determined that cross modulation is caused in the signal band of a desired wave signal by a plurality of interfering waves other than the desired wave signal, and the attenuation quantity of the variable attenuator 15 is controlled. Therefore, a cross modulation signal generated after the variable attenuator 15 can be suppressed.

FIGS. 2, 3 and 4 are views showing a constitution of a receiver disclosed in the second prior art. In FIG. 2, a signal received by the antenna 11 passes a resonance circuit 39 (details of which are described later with reference to FIG. 3), and is transmitted via an attenuator 41 to an RF portion 43. The RF portion 43 generates a signal for controlling the attenuation quantity of the attenuator 41 in accordance with an intensity of the received signal, thereby controlling the attenuator 41 so that the field intensity of the received signal transmitted to the RF portion 43 is at a constant level. The received signal (controlled to the constant level) is amplified in the RF portion 43, converted from an analog signal to a digital signal by an analog-digital converter (A/D) 45, and subsequently transmitted to a digital mixer 47. The digital mixer 47 also receives a local oscillating signal from a frequency synthesizer 49. In the digital mixer 47, the digital signal from the A/D 45 is converted to an intermediate frequency in a known heterodyne process. A control portion 51 is provided so as to control not only a frequency emitted from the frequency synthesizer 49 but a resonance frequency of the resonance circuit 39 provided on a front end of the receiver. FIG. 3 is a view showing an inner construction of the resonance circuit 39 of FIG. 2. The resonance circuit 39 includes a parallel LC resonance circuit 57 having a variable inductor 53 and a fixed capacitor 55; and a parallel LC resonance circuit 63 having a variable inductor 59 and a fixed capacitor 61 are connected in series. The variable inductors 53 and 59 can have inductance values controlled by control signals from the control portion 51 (see FIG. 2), respectively. Resonance frequencies of the parallel LC resonance circuits 57 and 63 can be changed. Frequency properties of the parallel LC resonance circuits 57 and 63 are shown in FIG. 4. The frequency properties of the parallel LC resonance circuits 57 and 63 operate as known notch filters which cause attenuation of 50dB or more at respective resonance frequencies of the circuits, and are not substantially attenuated in a frequency band other than the resonance frequencies.

According to the prior art, when, two or more interfering waves exist (other than the desired wave), a field strength of the received signal is large and a receiving sensitivity is degraded, then it is determined that the interfering waves are caused by cross modulation in a band of the desired wave frequency, and the interfering waves are removed by adapting the resonance frequencies of the parallel LC resonance circuits 57 and 63 to the frequencies of the interfering waves. Therefore, deterioration of the receiving sensitivity due to the cross modulation can be prevented.

A first problem with the afore-mentioned first prior art system is that since the deterioration of the receiving sensitivity by the cross modulation caused by a plurality of interfering waves (other than the received frequency) is determined by detecting whether or not the frame synchronous signal exists in a received frame. Therefore, it cannot be determined whether or not the cross modulation is caused by a plurality of interfering waves.

For example, in North America, there is a system called TIA.IS95, which has a pilot channel transmitting a signal for obtaining synchronization with the system, a synchronous channel transmitting a signal for obtaining frame synchronization and a plurality of channels of a traffic channel for transmitting voice or other information signals. Further, a transmission power ratio of each channel from a base station is different in such a manner that the pilot channel: the synchronous channel: the traffic channel=3:1:1. In the system, a plurality of intense interfering waves which cause cross modulation may exist, and a cross modulation signal produced by the interfering may drop in a band of a desired wave frequency. In this case, even if a receiver can obtain synchronization with the base station via the pilot channel, at the time of receipt of the traffic channel, the cross modulation signal caused by two or more interfering waves drops in the received band of the desired wave frequency, and the receiving sensitivity might be deteriorated. This is because the receiver takes a frame synchronous signal from a received frame, and it is determined using detection of the frame synchronous signal that the deterioration of the receiving sensitivity by the cross modulation caused by a plurality of interfering waves occurs. For example, like the aforementioned North American TIAoIS95 system, in which a synchronous signal is exchanged with the base station using a plurality of channels, the receiver determines, only by determining whether or not the frame synchronous signal is detected, that the deterioration of the receiving sensitivity by the cross modulation caused by a plurality of interfering waves occurs.

A second problem with the afore-mentioned first prior art system is that using the variable attenuator 15 inserted in the front end of the receiver, not only the cross modulation signal produced by a plurality of interfering waves but the field intensity of the received signals including the desired wave signal are adjusted. Therefore, the input power level of the demodulation signal transmitted to the demodulator 31 is not constant, and the demodulator 31 requires a very large input dynamic range.

Reasons for this are as follows. When the cross modulation is caused by a plurality of interfering waves, to suppress the cross modulation in or after the variable attenuator 15, the attenuation quantity of the variable attenuator 15 is controlled to be large. However, at the same time the cross modulation caused by a plurality of interfering waves is suppressed, the received power level of the desired wave transmitted to the demodulator 31 is also suppressed, and the input power level of the demodulator 31 is decreased. Also, when no interfering waves causing the cross modulation exist, attenuation quantity of the variable attenuator 15 is controlled to be a small. Therefore, the received power level transmitted to the demodulator 31 is large as compared with when the interfering waves exist.

A first problem with the aforementioned second prior art is that when a plurality of combined interfering waves causing cross modulation exist, a plurality of notch filters which can vary the resonance frequencies as shown in FIG. 3 are required at the front end of the receiver. Also, even when a plurality of variable notch filters are provided, the resonance frequency of the resonance circuit has to be synchronized with each of the frequencies of the interfering waves causing cross modulation. Therefore, controlling the resonance circuit becomes very complicated.

This is because the frequencies of the interfering waves causing the cross modulation are usually supposed to be a three-dimensional distortion component produced by the non-linearity of the high-frequency amplifier constituting the receiver. When the frequency of the desired wave is set as fc and the frequency of the interfering waves causing cross modulation is an optional fl, then fc+fl and fc+2fl or fc−fl and fc−2fl can be provided. An infinite number of combinations of the interfering wave frequencies exist. For this, it is difficult to provide a plurality of notch filters which can be synchronized to all the interfering wave frequencies. Further, it is difficult to control and synchronize the resonance frequency of the resonance circuit to all the interfering wave frequencies.

SUMMARY OF THE INVENTION

Therefore, a first object of the present invention is to provide a receiver for suppressing an $n(n \geq 2)$-dimensional distortion component produced by a non-linearity of a high-frequency amplifier, a frequency mixer and the like of a receiver.

Another object of the invention is to provide a receiver which can effectively prevent deterioration of the receiving sensitivity of the receiver when cross modulation caused when a plurality of interfering waves exists.

The inventors have noticed the $n(n \geq 2)$-dimensional distortion component produced by the non-linearity of the high-frequency amplifier, the frequency mixer and the like of the receiver has the property of increasing or decreasing by $n \, \alpha$ dB in proportion when the field intensity increases or decreases by $\alpha$ dB. A front end of the receiver is provided with a variable gain means having a gain quantity which can be controlled. After the receiver receives a signal transmitted from a base station, the gain quantity of the variable gain means is controlled, and the gain quantity of the variable gain means is attenuated by $\alpha$ dB. When a field level of the received signal being received by the receiver is $\beta$ dB or less, it is determined that the cross modulation by means of interfering waves does not occur, and the variable gain means is not controlled. However, when the gain quantity of the variable gain means is attenuated by $\alpha$ dB and the field level of the received signal being received by the receiver is attenuated by $\beta$ dB ($\alpha<\beta$) or more, it is determined that the cross modulation by a plurality of interfering waves occurs, and further the gain quantity of the variable gain means is controlled. The gain quantity of the variable gain means is increased until a bit error ratio of the received signal reaches a value which is not influenced by the cross modulation. Thus, the aforementioned problems are solved.

The invention provides a receiver, for achieving radio communication with a base station, having a receiving means for receiving a signal transmitted from the base station, a first filtering means having a bandwidth for passing only a desired wave among radio frequency band signals, a frequency conversion extraction means for converting the received signal in a radio frequency band to a signal in an intermediate frequency band and extracting the converted signal, and a control means for demodulating the received signal received by the receiver while controlling a gain of the received signal. The control means is provided with a demodulating means for demodulating the signal in the intermediate frequency band, and a first variable gain means installed before the frequency conversion extraction means and having a gain which can be controlled. The frequency conversion extraction means is provided with a second variable gain means having a gain which is controlled by the demodulating means.

In the receiver of the invention, the frequency conversion extraction means is preferably provided with a frequency conversion means for converting the received signal in the radio frequency band to the signal in the intermediate frequency band, a local signal oscillating means connected to an input of the frequency conversion means for oscillating a local signal used when the signal in the radio frequency band is converted to the signal in the intermediate frequency band, and a second filtering means provided between the first variable gain means and the demodulating means for passing only the received signal in the intermediate frequency band converted by the frequency conversion means and having a bandwidth as much as one channel. Also, in the receiver, the control means is provided with an error ratio calculation means for calculating an error ratio of the received signal from a demodulation result of the demodulating means and a gain quantity control means for controlling the gain of the first variable gain means. From a control quantity transmitted from the demodulating means for controlling the gain of the second variable means and a control quantity transmitted from the gain quantity control means for controlling the gain of the first variable gain means, a power quantity of the received signal being received at the present time is preferably obtained.

More specifically, the receiver according to the invention has the first variable gain means between an antenna for receiving a signal transmitted from the base station and an antenna sharer for separating a band of the received signal and a band of a transmitted signal. Further, the receiver has a demodulator, a control circuit having a bit error ratio calculation means for calculating a bit error ratio of the received signal and the gain quantity control means for controlling the gain quantity of the first variable gain means, and the second variable gain means for keeping constant the field level of the received signal transmitted to the demodulator.

The gain quantity of the first variable gain means is set to a minimum gain quantity beforehand. Upon receipt of a signal transmitted from the base station, the gain quantity of the second variable gain means is changed. The field level of the received signal (referred to as adBm) is set up to an input level satisfied by the demodulator. In this case, a gain control signal transmitted from the demodulator to the second variable gain means is a voltage value proportional to a gain variation. By comparing a gain control signal before a gain control with a gain control signal after the gain control, the control means can calculate the gain variation of the second variable gain means. Subsequently, by attenuating the gain quantity of the first variable gain means by α dB and again controlling the gain quantity of the second variable gain means, the field level of the received signal transmitted to the demodulator is set to adBm. In this case, if the gain variation of the second variable gain means is β dB or more, it is determined that the cross modulation by interfering waves occurs, and using the gain quantity control means, the gain quantity of the first variable gain means is further increased. Subsequently, the bit error ratio of the received signal is calculated using the bit error ratio calculation means. If the calculated bit error ratio is lower than a certain threshold level relative to a received field level, it is determined that the influence of cross modulation caused by the interfering waves cannot be removed, and the gain quantity of the first variable gain means is further increased. By repeating this method, the deterioration of the receiving sensitivity caused by the cross modulation due to the interfering waves can be effectively removed.

DETAILED DESCRIPTION OF THE PREFERRED EMBODIMENT

Figure 1:
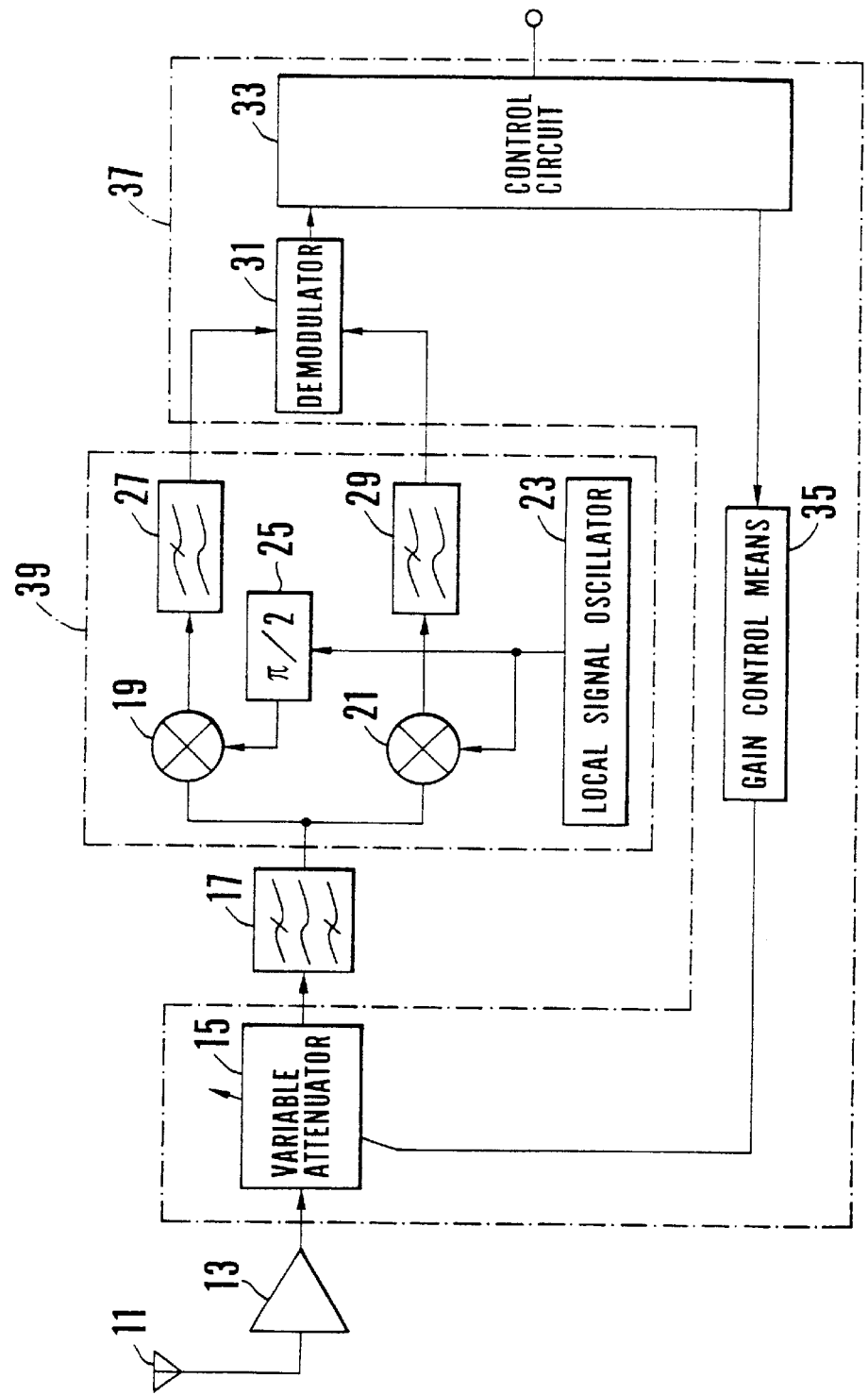
FIG. 1 is a block diagram showing a receiver of the prior art.
Figure 2:
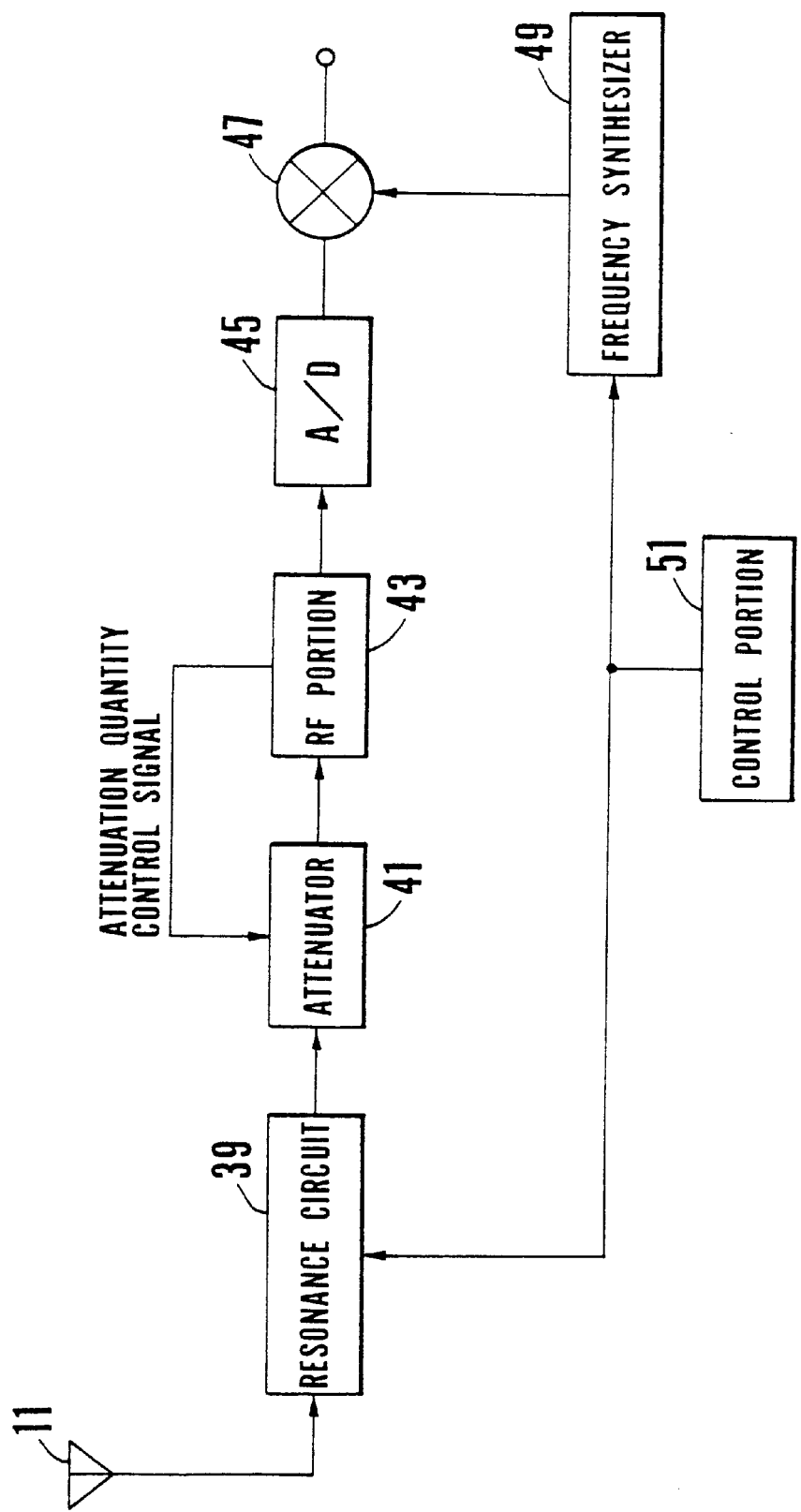
FIG. 2 is a block diagram showing another receiver of the prior art.
Figure 3:
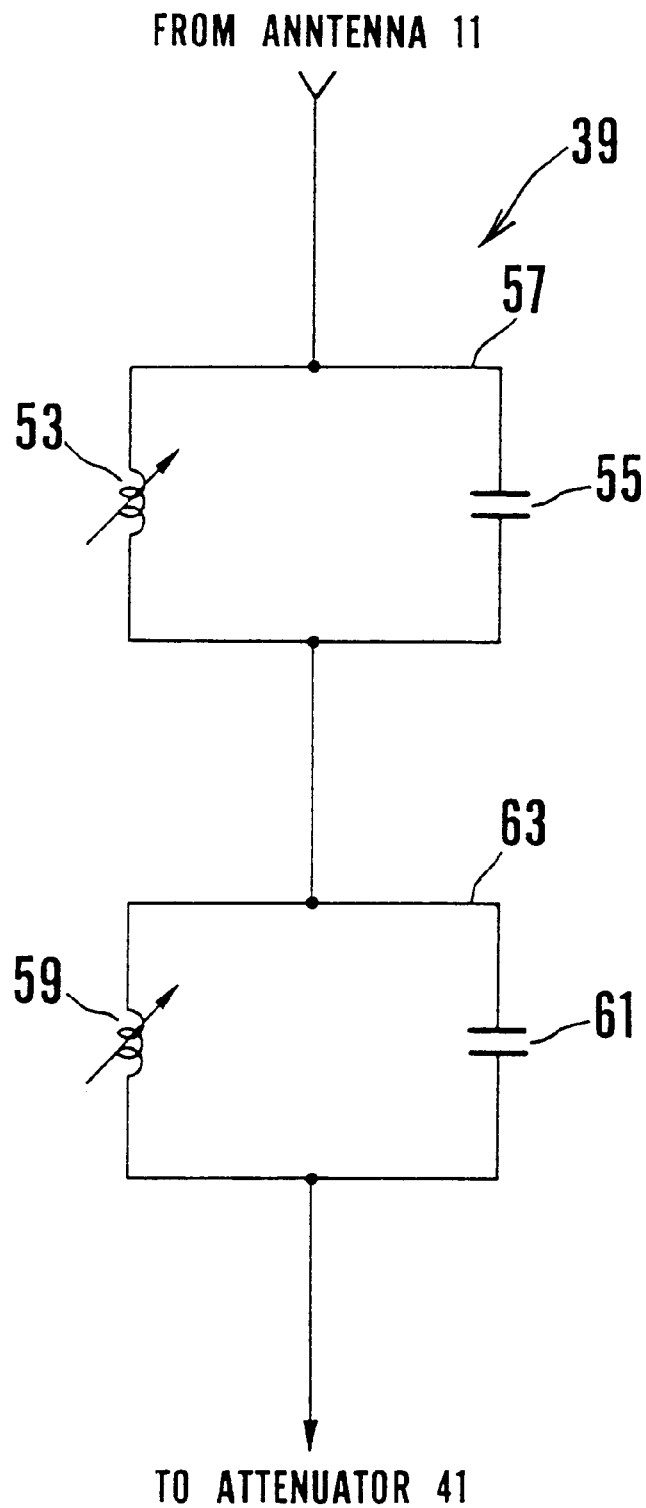
FIG. 3 is a block diagram showing a resonance circuit of the receiver according to the prior art shown in FIG. 2.
Figure 4:
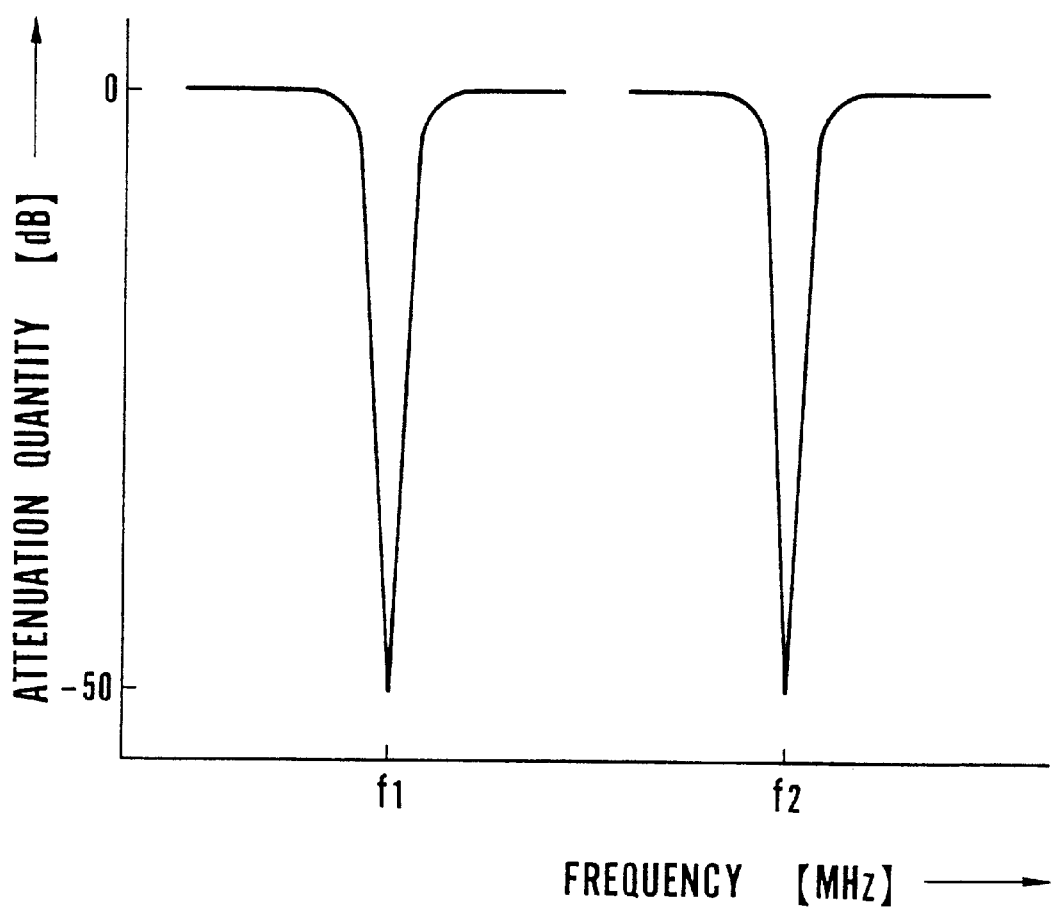
FIG. 4 is a view showing a frequency characteristic of the resonance circuit shown in FIG. 3.
Figure 5:
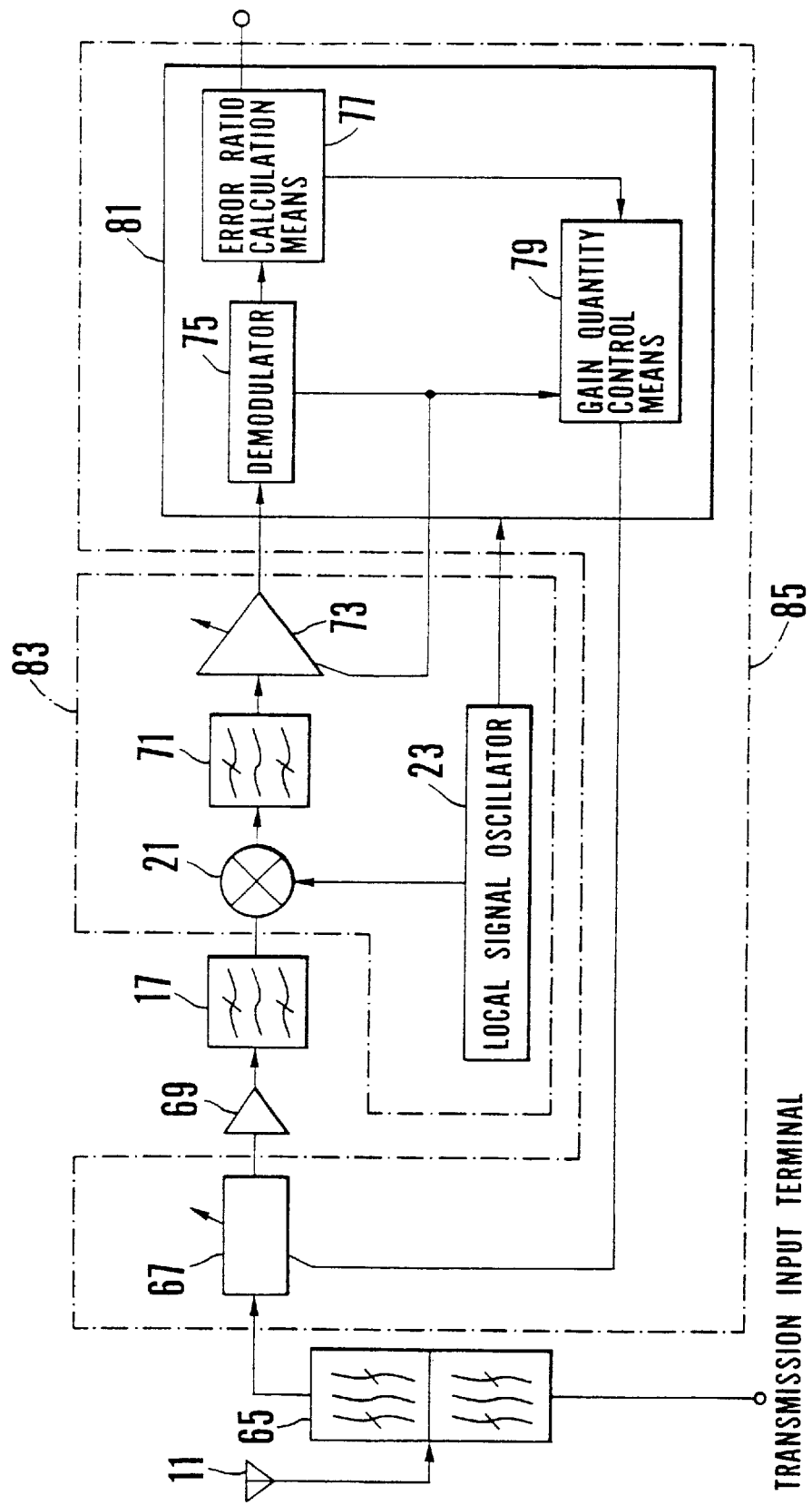
FIG. 5 is a block diagram showing a receiver according to an embodiment of the invention.

In the following, an embodiment of the present invention is detailed shown in FIG. 5. FIG. 5 is a block diagram showing a receiver according to an embodiment of the invention.

Referring to FIG. 5, the receiver is in the form of a super heterodyne system. The receiver is provided with an antenna 11 for receiving a signal transmitted from a base station (not shown) and an antenna sharer 65 having a first band bass filtering characteristic for passing only a received or transmitted radio signal and separating a received signal from a transmitted signal. The receiver also includes a first variable gain unit 67 for preventing deterioration of a receiving sensitivity (caused by cross modulation); a high-frequency amplifier 69 having a frequency band amplifying characteristic which includes a relatively large gain for decreasing a noise index of the entire receiver; and a band pass filter 17 having a second band pass filtering characteristic which includes a bandwidth in accordance with the received signal used in a radio frequency band for passing only an object desired wave signal. The receiver also includes a local signal oscillator 23 which provides a local oscillating signal used to convert the received signal in the radio frequency band to a received signal in an intermediate frequency band; and a frequency converter 21 for converting the received signal in the radio frequency band to the received signal in the intermediate frequency band using the local oscillating signal from the local signal oscillator 23. A band pass filter 71 is employed which has a third band pass filtering characteristic which includes a bandwidth of only one channel for passing only the received signal converted to the signal in the intermediate frequency band. A second variable gain units 73 is included which keeps constant a power level of the received signal; and a demodulator 75 is included for converting the received signal in the intermediate frequency band to a signal in a base band and further converting an analog signal to a digital signal. The receiver also includes an error ratio calculation unit 77 which calculates a bit error ratio of the demodulated digital signal; and a gain quantity control unit 79 which control the gain quantity of the first variable gain unit 67.

The demodulator 75, the error ratio calculation unit 77 and the gain quantity control unit 79 define a control circuit 81 to control operation of the entire receiver. Also, the control circuit 81 and the first variable gain unit 67 define a control means 85. Also, the frequency converter 21, the band pass filter 71, the second variable gain unit 73 and the local signal oscillator 23 define a frequency conversion extraction unit 83.

The antenna 11 is connected to an input/output end common to transmission and receipt of the antenna sharer 65. A receiving-side output end of the antenna sharer 65 is connected to an input of the first variable gain unit 67. The first variable gain means 67 can be a gain controlled via a control signal transmitted from the gain quantity control unit 79 in the control circuit 81. A transmission-side input end of the antenna sharer 65 is connected to an output of a transmission large gain amplifier (not shown). An output of the first variable gain unit 67 is connected to an input of the high-frequency amplifier 69, and an output of the high-frequency amplifier 69 is connected to an input of the band pass filter 17. An output of the band pass filter 17 is connected to an input end of the frequency converter 21 for receiving the signal in the radio frequency band. Further, an output of the local signal oscillator 23 is connected to another input end for the local oscillating signal of the frequency converter 21. An oscillating frequency of the local signal oscillator 23 can be optionally set by the control circuit 81. An output end of the frequency converter 21 is connected to an input end of the band pass filter 71, and an output end of the band pass filter 71 is connected to an input end of the second variable gain unit 73. The second variable gain unit 73 can be gain controlled by a control signal transmitted from the demodulator 75 in the control circuit 81. An output end of the second variable gain unit 73 is connected to an input of the demodulator 75 in the control circuit 81, and an demodulation output of the demodulator 75 is connected to the error ratio calculation unit 77. The control signal emitted from the demodulator 75 for controlling the gain quantity of the second variable gain unit 73 and the control signal from the error ratio calculation unit 77 are connected to the gain quantity control unit 79.

Operation of the invention is now detailed referring again to FIG. 5. First the receiver sets the gain quantity of the first variable gain unit 67 to be a minimum gain quantity. The signal received by the antenna 11 passes the antenna sharer 65 and is provided to the first variable gain unit 67. The signal having passed the first variable gain unit 67 is provided to the high-frequency amplifier 69, amplified in the high-frequency amplifier 69, and provided to the band pass filter 17. Subsequently, the received signal having passed the band pass filter 17 is transmitted to the frequency converter 21. In the frequency converter 21, the inputted received signal in the radio frequency band and the local oscillating signal from the local signal oscillator 23 are mixed and, converted to the signal in the intermediate frequency band. The received signal converted to the signal in the intermediate frequency band by the frequency converter 21 passes the band pass filter 71, and is provided to the second variable gain unit 73. The received signal produced by the second variable gain unit 73 is provided to the demodulator 75 in the control circuit 81. The demodulator 75 emits the control signal for controlling the gain quantity of the second variable gain unit 73 in accordance with the power level of the received signal transmitted to the demodulator 75, and the gain quantity of the second variable gain unit 73 is controlled, so that the power level of an output signal from the second variable gain unit 73 is constant. In this case, the control signal emitted from the demodulator 75 for controlling the gain quantity of the second variable gain unit 73 is a voltage value which increases or decreases in proportion to the gain quantity of the second variable gain unit 73. In the control circuit 81, based on the voltage level of the control signal, the power level transmitted to the second variable gain unit 73 can be determined, and from an increase/decrease level of the entire gain, the received power level transmitted to the antenna 11 can be determined. The demodulator 75 demodulates the received signal, concurrently converts the received signal to a base band signal, further converts an analog signal to a digital signal, and emits the signal. The signal emitted from the demodulator 75 is digitally processed in a base band applied at the base station in the error ratio calculation unit 77, which calculates the bit error ratio of the received signal.

Usually, a cross modulation signal produced by two or more interfering waves is an n-dimensional distortion component caused by the non-linearity of the high-frequency amplifier 69 and the frequency converter 21 constituting the receiver. The distortion component has a property of increasing or decreasing by n $\alpha$ dB in proportion as a power of the cross modulation signal increases or decreases by $\alpha$ dB.

Using this property, the receiver according to the invention receives a signal transmitted from the base station, controls the gain quantity of the second variable gain unit 73, keeps constant the power level of the received signal transmitted to the demodulator 75, and at the same time determines the power level of the received signal received at the end of the antenna 11. Subsequently, the control circuit 81 controls the gain quantity of the first variable gain unit 67 using the gain quantity control unit 79, to attenuate the gain quantity of the first variable gain unit 67 by $\alpha$ dB and attenuates the input power level of the received signal transmitted to the demodulator 75 by $\alpha$ dB. Then, the demodulator 75 operates to keep constant the power level of the received signal transmitted thereto, and, therefore, emits a control signal for increasing the gain quantity of the second variable gain unit 73. When the gain variation of the second variable gain unit 73 is within $\beta$ dB, for example, the gain quantity of the first variable gain unit 67 is attenuated by 1 dB. In this case, when the variation of the power level of the control signal emitted from the demodulator 75 for controlling the gain of the second variable gain unit 73 corresponds to the variation for increasing the gain quantity of the second variable gain unit 73 by 1 dB, then the control circuit 81 determines that no cross modulation signal is produced by the interfering waves. The gain quantity of the first variable gain unit 67 is controlled so as to return to the initial gain quantity, via the gain quantity control unit 79 for controlling the gain quantity of the first variable gain unit 67. Specifically, the gain quantity of the first variable gain unit 67 is increased by 1 dB.

When a gain variation exceeding $\beta$ dB is needed for the gain variation of the second variable gain unit 73, the gain quantity of the first variable gain unit 67 is attenuated by 1 dB. In this case, when the variation of the power level of the control signal emitted from the demodulator 75 for controlling the gain of the second variable gain unit 73 corresponds to the variation of the gain quantity of the second variable gain unit 73 exceeding 2 dB, then the control circuit 81 determines that the cross modulation signal is generated by the interfering waves at or after the first variable gain unit 67. The gain quantity of the first variable gain unit 67 is controlled and further increased via the gain quantity control unit 79 for controlling the gain quantity of the first variable gain unit 67. Specifically, the control circuit 81 controls the gain quantity of the first variable gain means 67 to be further attenuated by $\alpha$ dB, via the gain quantity control unit 79. Thereafter, the received signal is demodulated by the demodulator 75 and converted to the base band signal, the analog signal is converted to the digital signal, then the error ratio calculation unit 77 calculates the bit error ratio of the received signal. Since the demodulator 75 controls the gain quantity of the second variable gain unit 73, the control circuit 81 knows the power level of the received signal. From the thermal noise level of the receiver itself and the power level of the received signal, the control circuit 81 determines whether or not the bit error ratio calculated by the error ratio calculation unit 77 is influenced by the cross modulation caused by the interfering waves, i.e. whether or not the receiving sensitivity of the receiver is deteriorated by the cross modulation.

As a result, when the control circuit 81 determines that the receiving sensitivity of the receiver is deteriorated, the control circuit 81 further attenuates the gain quantity of the first variable gain unit 67 via the gain quantity control unit 79 for controlling the gain quantity of the first variable gain unit 67, and repeats the aforementioned process.

On the other hand, when the control circuit 81 determines that the receiving sensitivity of the receiver is not deteriorated, the control over the first variable gain unit 67 is stopped, and signals are received from the base station for a predetermined time. After the predetermined time elapses, the gain quantity of the first variable gain unit 67 is again attenuated by α dB, and the second variable gain unit 73 is controlled. To keep constant the input power level to the demodulator 75, the variation of the gain required for the second variable gain unit 73 is monitored, and it is determined whether or not a plurality of interfering waves exist. When the interfering waves continue to exist, i.e. when the second variable gain unit 73 requires the gain variation of β dB or more, the gain quantity of the first variable gain unit 67 is attenuated by α dB. The aforementioned process is repeated.

Also, when it is determined that the interfering waves do not exist and the receiving sensitivity of the receiver is not deteriorated by cross modulation, i.e. when the second variable gain unit 73 only requires the gain variation within β dB, the control circuit 81 controls the gain quantity of the first variable gain unit 67 to return to the initial condition via the gain quantity control unit 79 for controlling the gain quantity of the first variable gain unit 67. Further, after the predetermined time elapses, the control circuit 81 again controls the gain quantity of the first variable gain unit 67, so that the gain quantity of the first variable gain unit 67 is attenuated from the initial gain quantity by α dB. The control circuit 81 monitors the presence of the cross modulation signal produced by the interfering waves. By detecting the presence of the cross modulation signal produced by the interfering waves, the aforementioned process is repeated.

As aforementioned, according to the receiver of the present invention, the cross modulation signal is an n-dimensional distortion component produced by the non-linearity of the high-frequency amplifier and the frequency mixer constituting the receiver, and has a property of increasing or decreasing by α dB in proportion when the field intensity increases or decreases by α dB. At the front end of the receiver, the first variable gain unit whose gain quantity can be controlled is provided, and the second variable gain unit is provided before the demodulator. After the receiver receives the signal transmitted from the base station, the gain of the second variable gain unit is controlled, and the input power level to the demodulator is set up to the power level which can be satisfied by the demodulator. Thereafter, the gain quantity of the first variable gain unit provided on the front end of the receiver is attenuated by α dB, then the gain of the second variable gain unit is again controlled. In this case, to set the field level of the received signal transmitted to the demodulator to the power level applied in the previous process, the gain variation of β dB or more is required for the second variable gain unit. For example, when the field level of the received signal is attenuated by 1 dB at the front end of the receiver, while an attenuation of 2 dB or more is caused before the demodulator, then it is determined that cross modulation is caused by two or more interfering waves. Further, the gain quantity of the first variable gain unit is controlled, until the bit error ratio of the received signal reaches a sufficient value relative to the field level being received. Therefore, the presence of the cross modulation signal can be determined without requiring a complicated process. The receiving sensitivity of the receiver can be prevented from being deteriorated by the cross modulation signal.

Also, according to the present invention, when two or more interfering waves exist and the cross modulation signal is produced, to eliminate the deterioration of the receiving sensitivity of the receiver by means of the cross modulation signal, the front end of the receiver is provided with the first variable gain unit. Further, the second variable gain unit is provided after the high-frequency amplifier and the frequency mixer which tend to produce the cross modulation signal by unit of two or more interfering waves. The second variable gain unit is controlled using the demodulator for demodulating the received signal. The gain quantity of the first variable gain unit is increased and the power level of the received signal is decreased, so that cross modulation is prevented from arising at the high-frequency amplifier and the frequency mixer which are provided after the first variable gain unit. Even in this case, the gain of the second variable gain unit can be controlled, thereby keeping the received power at a constant level. Therefore, even when the gain quantity of the first variable gain unit is set to a remarkably large value, the received signal can be demodulated with the received power of the constant level.

What is claimed is:

1. A receiver for achieving radio communication with a base station, the receiver comprising:

an antenna operable to receive a signal transmitted from said base station;

a first band pass filter having a bandwidth for passing only a desired wave among radio frequency band signals;

a frequency conversion extraction unit operable to convert a received signal in a radio frequency band to a signal in an intermediate frequency band and extract the converted signal;

a control unit operable to demodulate the received signal and control a gain of said received signal, said control unit including a demodulator operable to demodulate said signal in the intermediate frequency band from said frequency conversion extraction unit, and a first variable gain unit provided before said frequency conversion extraction unit, the first variable gain unit having a gain which can be controlled, the control unit initially controlling the gain of said first variable gain unit to a maximum; and said frequency conversion extraction unit including a second variable gain unit having a gain which is controlled by said demodulator such that an input power quantity into said demodulator is substantially constant.

2. The receiver according to claim 1, wherein said frequency conversion extraction unit includes:

a frequency conversion unit operable to convert said received signal in the radio frequency band to said signal in the intermediate frequency band;

a local signal oscillator operable to provide a local signal used to produce said signal in the intermediate frequency band; and a second bandpass filter provided between said first variable gain unit and said demodulator operable to pass only said received signal in the intermediate frequency band and having a bandwidth which is limited to one channel.

3. The receiver according to claim 2, wherein said control unit includes:

an error ratio calculation unit operable to calculate an error ratio of said received signal from a demodulation result from said demodulator; and a gain quantity control unit for controlling the gain of said first variable gain unit such that a power quantity of the received signal is obtained as a function of a control quantity transmitted from said demodulator which controls the gain of said second variable gain unit and a control quantity transmitted from said gain quantity control unit which controls the gain of said first variable gain unit.

4. The receiver according to claim 3, wherein:

said demodulator controls said second variable gain unit in response to said control unit decreasing the gain of said first variable gain unit by $\alpha$ dB to keep the input power quantity to said demodulator constant;

said first variable gain unit is reset to the initial maximum value and it is determined that a cross modulation signal does not deteriorate a receiving sensitivity of said receiver when the gain variation of said second variable gain unit is $\beta$ dB or less;

the error ratio calculation unit determines the error ratio of the signal demodulated by said demodulator, it is determined that two or more interfering waves causing cross modulation exist, and a determination is made as to whether or not a deterioration of the receiving sensitivity of said receiver by cross modulation occurs, based on a present received power quantity and said calculated error ratio, when the gain variation of said second variable gain unit requires a variation exceeding $\beta$ dB; and the gain of said first variable gain unit is further decreased and said control unit repeats control until the error ratio of said receiver becomes less than a predetermined value when it is determined that the deterioration of the receiving sensitivity of said receiver occurs.

5. The receiver according to claim 4, wherein said control unit (i) does not control said first variable gain unit and, after a predetermined period of time elapses, (ii) decreases the gain of said first variable gain unit by $\alpha$ dB, and (iii) determines whether or not the deterioration of the receiving sensitivity by the cross modulation occurs, when said control means determines that the deterioration of the receiving sensitivity by the cross modulation does not occur.

6. The receiver according to claim 5, wherein said gain variations $\alpha$ and $\beta$ have a relationship of about $2\alpha=\beta$.

7. The receiver according to claim 6, wherein the control unit, determines that the deterioration of the receiving sensitivity exists when the present received power quantity is larger than the predetermined value and the error ratio calculated by said error ratio calculation unit exceeds the predetermined value.

8. The receiver according to claim 3, wherein a radio frequency band amplifier is provided after said first variable gain unit which has a substantially large constant gain for reducing noise in said receiver, said frequency band being the intermediate frequency band, and said demodulator being a super heterodyne system.

9. The receiver according to claim 8, further comprising a third bandpass filter having a bandwidth which passes only a desired wave signal from the received signal and from the radio frequency band signals used in said radio communication, said third bandpass filter having an output end connected to an input end of said second variable gain amplifier, said first band pass filter being an antenna sharer.

10. A receiver for achieving radio communication, comprising:

an antenna operable to receive a signal transmitted from a base station;

a first band pass filter having an input end coupled to said antenna and having a bandwidth for passing only desired signals among received signals in a radio frequency band;

a first variable gain unit connected to an output end of said first band pass filter and having a gain which can be controlled;

a radio frequency band amplifier having a relatively large constant gain for reducing a noise quantity in said receiver;

a second band pass filter coupled to an output end of said radio frequency band amplifier and having a bandwidth for passing only desired waves in said radio frequency band;

a frequency converter having an input end for receiving signals in the radio frequency band from said second band pass filter for converting the received signal in the radio frequency band to a signal in an intermediate frequency band;

a local oscillator connected to an input end of said frequency converter, the local oscillator providing an oscillating local signal used when the signal in the radio frequency band is converted to the signal in the intermediate frequency band;

a third band pass filter coupled to an output end of said frequency converter and operable to pass substantially only the signal in the intermediate frequency band, the third bandpass filter having a bandwidth of one channel;

a second variable gain unit being coupled to said third band pass filter and having a gain which can be controlled;

a demodulator operable to demodulate the received signal and coupled to an output end of said second variable gain unit, the demodulator being operable to control the gain of said second variable gain unit via a control quantity;

an error ratio calculation unit coupled to an output end of said demodulator and being operable to calculate an error ratio of the received signal from the demodulator; and a gain quantity control unit operable to control the gain of said first variable gain unit via a control quantity;

said receiver being operable to provide a power quantity of the received signal from the control quantity from said demodulator and the control quantity from the gain quantity control unit said receiver being further operable to set the gain of the variable gain unit to a maximum gain and, after receiving the signal from the base station, controls the gain of said second variable gain unit via said demodulator such that an input power quantity of said demodulator is constant.

11. The receiver according to claim 10, wherein;

said demodulator controlling the gain of said second variable gain unit such that said input power quantity to said demodulator is constant when the gain of said first variable gain unit is decreased by $\alpha$ dB;

said first variable gain unit is reset to the initial maximum value and it is determined that a cross modulation signal does not deteriorate a receiving sensitivity of said receiver when the gain variation of said second variable gain unit is $\beta$ dB or less;

the error ratio calculation unit determines the error ratio of the signal demodulated by said demodulator, and it is determined that two or more interfering waves causing cross modulation exist, based on a present received power quantity and said calculated error ratio, when the gain variation of said second variable gain unit requires a variation exceeding β dB;

said gain quantity control unit further decreasing the gain of said first variable gain unit when it is determined that the deterioration of the receiving sensitivity of said receiver occurs, and control is repeated until the error ratio of said receiver falls below a predetermined value;

said gain quantity control unit not controlling said first variable gain unit until a predetermined time elapses where the gain quantity control unit again decreases the gain of said first variable gain unit by α dB and determines whether or not the deterioration of the receiving sensitivity by the cross modulation occurs.

12. The receiver according to claim 11, wherein said gain variations α and β have a relationship of about 2α=β.

13. The receiver according to claim 11, wherein it is determined that the deterioration of the receiving sensitivity occurs at the time of determining the deterioration of the receiving sensitivity by the cross modulation and when the present receiving power quantity is larger than the predetermined value, but the error ratio exceeds the predetermined value.

* * * * *